(12) United States Patent
Detweiler et al.

(10) Patent No.: US 8,273,523 B2
(45) Date of Patent: Sep. 25, 2012

(54) BY-DIE-EXPOSURE FOR PATTERNING OF HOLES IN EDGE DIE

(75) Inventors: Shangting Detweiler, Dallas, TX (US); Basab Chatterjee, Allen, TX (US); Chris D. Atkinson, Lewisville, TX (US); Richard L. Guldi, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1308 days.

(21) Appl. No.: 11/617,130

(22) Filed: Dec. 28, 2006

(65) Prior Publication Data
US 2008/0160779 A1 Jul. 3, 2008

(51) Int. Cl.
G03F 7/20 (2006.01)
(52) U.S. Cl. ........................................... 430/313
(58) Field of Classification Search .................. 430/311, 430/313, 322, 323
See application file for complete search history.

(56) References Cited

U.S. PATENT DOCUMENTS

| | | | |
|---|---|---|---|
| 6,586,829 B1 * | 7/2003 | Yaniv et al. | 257/693 |
| 2001/0004479 A1 * | 6/2001 | Cheung et al. | 427/553 |
| 2005/0224724 A1 * | 10/2005 | Hubert Jacobus Carpaij et al. | 250/492.22 |
| 2006/0078828 A1 | 4/2006 | Atkinson et al. | |
| 2008/0212053 A1 * | 9/2008 | Ottens et al. | 355/53 |

* cited by examiner

*Primary Examiner* — Brittany Raymond
(74) *Attorney, Agent, or Firm* — Alan A. R. Cooper; Warren L. Franz; Frederick J. Telecky, Jr.

(57) ABSTRACT

In accordance with the invention, there are semiconductor devices and methods of making semiconductor devices and holes. The method of making a semiconductor device can comprise forming a photoresist layer over a surface of a wafer, wherein the wafer comprises an edge that has a substantially rounded profile, an array of dies, and at least one edge die. The method can also comprise dividing a shot area into a plurality of shot portions and assigning a blind ID to each of the plurality of shot portions. The method can further comprise identifying one or more edge shot portions on the edge of the wafer for additional exposure; and exposing one or more times identified one or more edge shot portions on the edge of the wafer and blocking non-identified one or more non-edge shot portions.

18 Claims, 5 Drawing Sheets

BY-DIE-EXPOSURE FOR PATTERNING OF HOLES IN EDGE DIE

FIELD OF THE INVENTION

The subject matter of this invention relates to fabricating a semiconductor device. More particularly, the subject matter of this invention relates to a system and method for the exposure of edge dies.

BACKGROUND OF THE INVENTION

Conventional semiconductor fabrication utilizes a scanner or other light source to form devices or features on the surface of a wafer. More specifically, a beam of light is directed at a portion of the wafer through a mask to cover a spatial area called the "shot" area. The shot area generally covers a group of dies on the wafer or a single die depending on the size of the die and the configuration of the mask. For the case of multiple dies within a shot, the shot area covers an array of die—for example, three die in one direction and two die in the perpendicular direction. This configuration is referred to as a 'full shot.' At the edge of the wafer where the full die or full shot pattern is not present, the shot area consists of a 'partial shot' where only the actual die printed on the wafer are exposed, not the complete 'full shot'. Sometimes partial die at the wafer edge are also printed as part of the shot. Although a wafer has a generally horizontal surface on which the features are formed, the edge of the wafer is typically rounded such that the wafer has a substantially rounded profile. Typically, the light source is operated at a standard exposure intensity for all devices and features formed on the surface of the wafer regardless of the location of the particular devices and features on the surface of the wafer. This results in a situation in which the same exposure intensity is used near the center of the wafer and at the edge of the wafer. This standard exposure intensity, however, can result in deformities in the features formed near the rounded edge of the wafer, especially on partial edge shots. In particular, via holes with small dimension and high aspect ratio are difficult to pattern on the wafer edge dies due to wafer edge topography. Furthermore, if the edge dies use the same exposure as center dies, via holes formed around the edge can be either small in diameter or not open at all. To address this problem, a common practice is to employ a technique called 'By-Shot-Exposure (BSE),' in which the exposure is adjusted for each shot at different locations across a wafer.

By-Shot-Exposure (BSE) affords the ability to use higher exposure on edge shots than on center shots. However it does not permit localized exposure adjustment on dies within a shot. Some edge shot dies reside on the flat part of the wafer. These die should be printed using standard exposure. Although theoretically all dies can be exposed with different, optimized exposures, compromised scanner throughput makes this impractical.

Accordingly, there is a need to overcome these and other problems of the prior art to provide a new method for patterning holes at wafer edge.

SUMMARY OF THE INVENTION

In accordance with the invention, there is a method of making a semiconductor device. The method can include forming a photoresist layer over a surface of a wafer, wherein the wafer includes an edge that has a substantially rounded profile, an array of dies, and at least one edge die. The method can also include dividing a shot area into a plurality of shot portions and assigning a blind ID to each of the plurality of shot portions. The method can further include identifying one or more edge shot portions on the edge of the wafer for additional exposure; and exposing one or more times identified one or more edge shot portions on the edge of the wafer and blocking non-identified one or more non-edge shot portions.

According to another embodiment of the present teachings, there is a system for forming a semiconductor device on a surface of a wafer. The system can include a controller disposed to position a wafer proximate to a light source, wherein the wafer includes a photoresist layer over a surface of the wafer, an edge that has a substantially rounded profile, an array of dies, and at least one edge die and to divide a shot area into a plurality of shot portions. The controller can also be disposed to assign a blind ID to each of the plurality of shot portions, identify one or more edge shot portions on the edge of the wafer for additional exposure, expose one or more times identified one or more edge shot portions on the edge of the wafer, and block non-identified one or more non-edge shot portions. The system for forming a semiconductor device on a surface of a wafer can also include a light source coupled to the controller.

According to yet another exemplary embodiment, there is a method of making one or more holes. The method can include forming a photoresist layer over a surface of a wafer, wherein the wafer includes an edge that has a substantially rounded profile, an array of dies, and at least one edge die and dividing a shot area into a plurality of shot portions. The method can also include assigning a blind ID to each of the plurality of shot portions, identifying one or more edge shot portions on the edge of the wafer for additional exposure, and exposing one or more times identified one or more edge shot portions on the edge of the wafer and blocking non-identified one or more non-edge shot portions. The method can further include developing the photoresist layer over the surface of the wafer to form a hole pattern and etching through the hole pattern into a dielectric layer proximate the photoresist layer.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

Figure 1A:
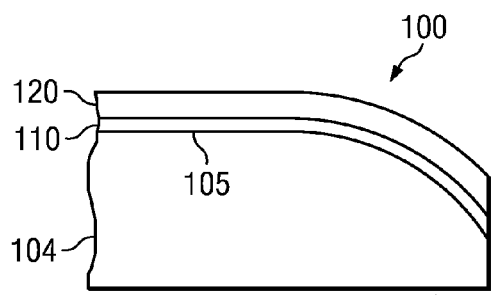
FIGS. 1A-1E illustrate an exemplary conventional method of making a semiconductor device.
Figure 1B:
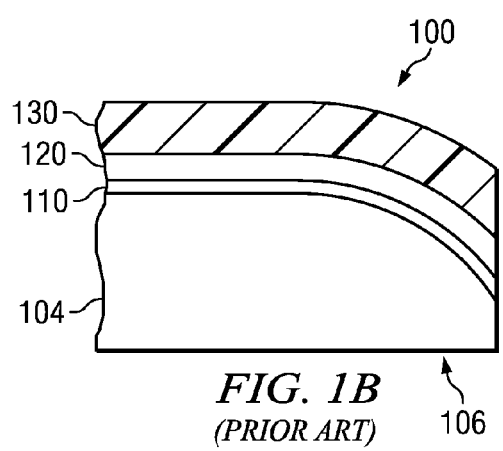
Figure 3A:
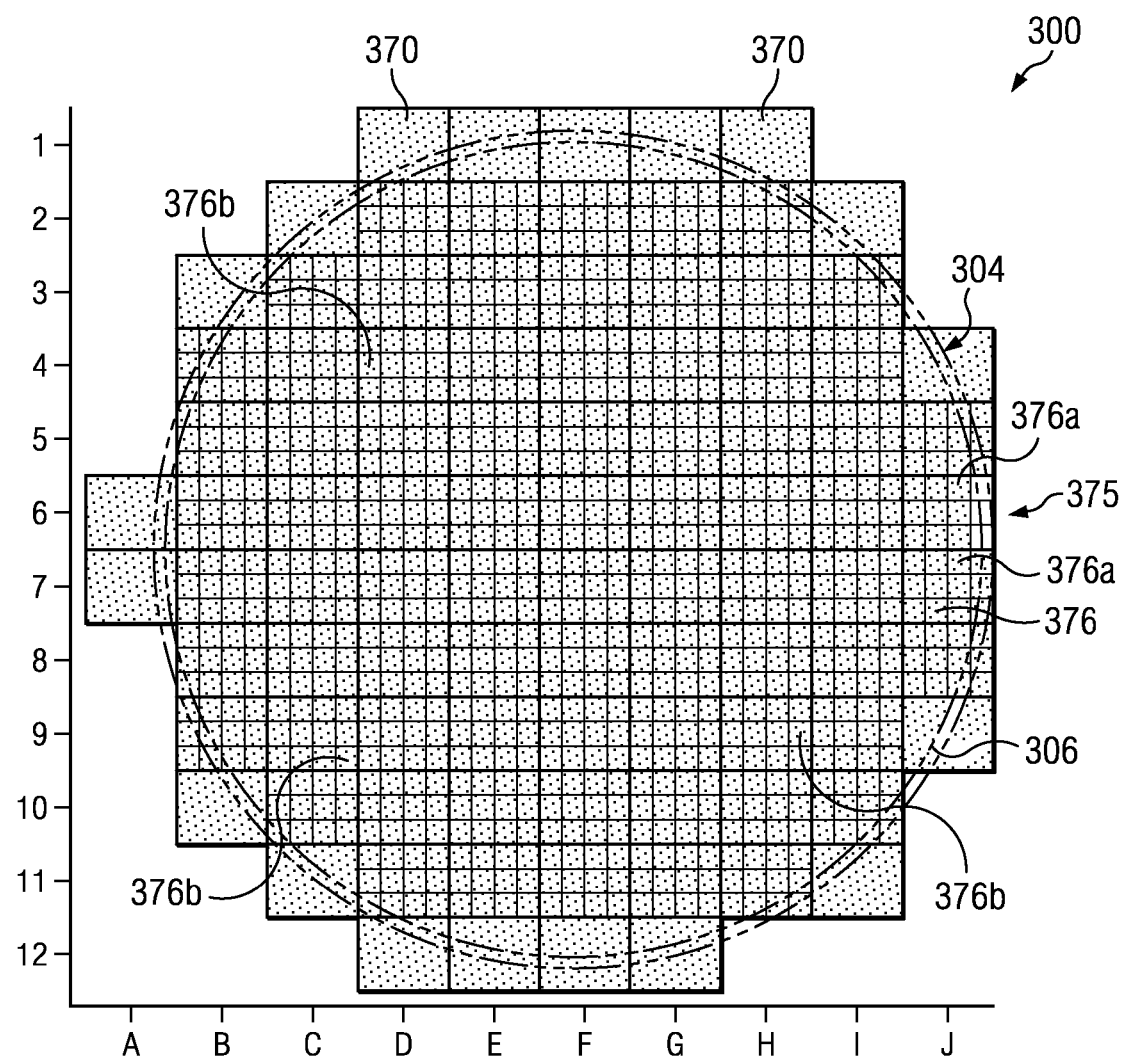
FIG. 3A is a schematic illustration of a wafer map showing an exemplary array of dies.

FIGS. 1A-1E illustrates an exemplary conventional method of making a semiconductor device 100. The method of making a semiconductor device 100 can include forming a photoresist layer 130 over a surface 105 of a wafer 104, wherein the wafer 104 includes a circumferential edge 106 that has a substantially rounded profile, as shown in FIGS. 1A and 1B, an array of dies 376, and at least one edge die 376a as shown in FIG. 3A. FIG. 3A also shows an exemplary case, where a full shot 370 can cover an array of four dies by three dies. Also shown in FIG. 3A is an exemplary partial shot 375, identified by the coordinate J6, covering an array of three dies by three dies, the actual dies printed on the wafer 304.

In some embodiments, the outer region about 1 mm to about 10 mm of wafer 104, as measured from the circumferential edge 106 of the wafer 104, can include the substantially rounded portion of surface 105. The deviation from the flat surface or substantially horizontal region of the wafer 104 in this outer region about 1 mm to about 10 mm can be as large as about 1 μm to about 10 μm. The depth-of-focus for ensuring hole integrity is typically about 0.1 μm to about 1 μm for a hole width on the order of about 40 nm to about 250 nm.

The wafer 104 can include silicon, gallium arsenide, or other suitable substrate material. According to one typical fabrication technology, the wafer 104 can be 300 mm in diameter and can have a thickness on the order of about 0.5 mm to about 2.0 mm. One of ordinary skill in the art will understand that a wafer 104 of any size, such as, for example from about 25.4 mm to about 450 mm can be used. The wafer 104 can provide a foundation on which one or more semiconductor devices or features can be created using a variety of techniques and procedures, such as layering, photolithographic patterning, doping through implantation of chemical impurities, and heating.

The surface 105 of the wafer 104, 304 can be partitioned into a plurality of dies 376 as shown in FIG. 3A. As used herein, the term "die" refers to each portion of the wafer 104, 304 that can support one or more features after semiconductor fabrication processes are performed on the surface 105 of the wafer 104, 304 and the wafer 104, 304 is cut into individual semiconductor devices. The term "edge dies", 376a as used herein refers to those dies that are located proximate to the edge 106 of the wafer 104. The edge dies 376a lie at least partially on the substantially rounded circumferential edge region 106, 306 of the wafer 104, 304. Thus, the edge dies 376a can be partly on the top surface of the wafer 104, 304 that is substantially horizontal and partly on the top surface of the wafer 104, 304 that has a substantially rounded profile. By contrast, complete or full dies 376b, as shown in FIG. 3A, are those dies 376 that are not edge dies 376a and, thus, lie completely on the top surface of the wafer 104, 304 that is substantially horizontal.

Referring back to FIGS. 1A to 1E, the step of forming a photoresist layer 130 over a surface 105 of a wafer 104 can also include forming an etch stop layer 110 over the surface of the wafer 105, forming a dielectric layer 120 over the etch stop layer 110, and forming a photoresist layer 130 over the dielectric layer 120.

Figure 1C:
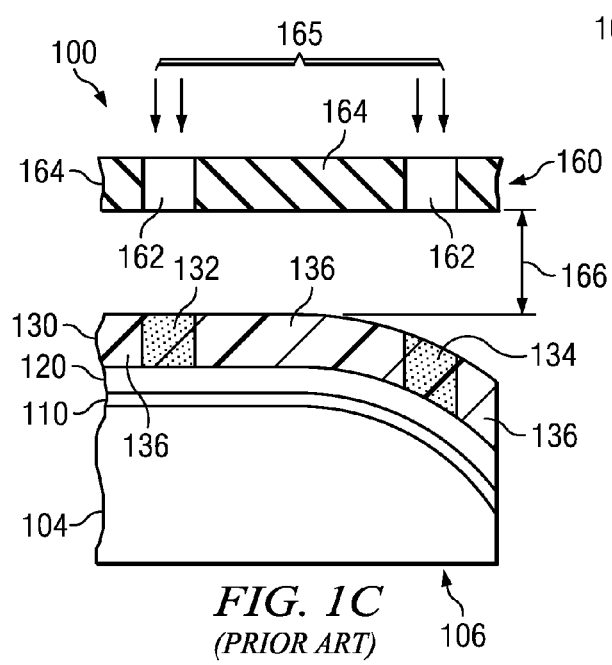

The method of making a semiconductor device 100 can also include exposing the photoresist layer 130 through a mask 160 to create a photolithographic image 132, 134 on the wafer 104, as shown in FIG. 1C. Mask 160 can include a metal layer with one or more blocking portions 164 and one or more apertures 162. The term "blocking portion" as used herein refers to completely or partially opaque regions of the mask 160 and the term "aperture" as used herein refers to completely or partially transparent regions of the mask 160. Light 165 incident on the mask 160 can be reflected by the blocking portions 164 and can be transmitted through the apertures 162 to reach the photoresist layer 130 over the surface 105 of the wafer 104. Hence, the blocking portions 164 prevent the transmission of light 165 to regions 136 of the photoresist layer 130 and leaves the regions 136 unexposed. Furthermore, the shape and size of the aperture 162 of the mask 160 can determine the shape and size of a corresponding exposed region 132,134 of the photoresist layer 130 and also the shape and size of the features formed on the dielectric layer 120 over the surface of the wafer 104.

Another factor contributing to the formation of exposed region 132,134 is the mask-to-wafer distance 166 between the mask 160 and the wafer 104. Mask-to-wafer distance 166 can be measured from a position on wafer 104 that is proximate to the center of wafer 104. A mask-to-wafer distance 166 either higher or lower than a given range can result in a feature with dimensions that are different from the desired dimensions.

As shown in FIG. 1C, the mask 160 can include two exemplary apertures 162. Accordingly, the two exposed regions 132 and 134 can be generated from a single exposure of light 165 from a light source (not shown). The exposed region 132 can be located on the substantially horizontal region of the wafer 104. On the other hand, the exposed region 134 can be located proximate to the circumferential edge 106 of the wafer 104. As illustrated in FIG. 1C, the mask 160 can be positioned relative to the surface 105 of the wafer 104 such that the mask-to-wafer distance 166 can be at an optimum value for forming the exposed region 132. However, the mask-to-wafer distance 166 between the mask 160 and the exposed portion 134 can be greater than the mask-to-wafer distance 166 between the mask 160 and the exposed region 132. Consequently, the exposure of wafer 104 to light 165 at standard exposure intensities can result in a feature corresponding with the exposed region 134 having narrower dimensions than desired. Accordingly, the feature formed can be said to be underexposed. Underexposed deformities in the semiconductor devices and features can result in via holes that are either not fully opened or not opened at all.

Figure 1D:
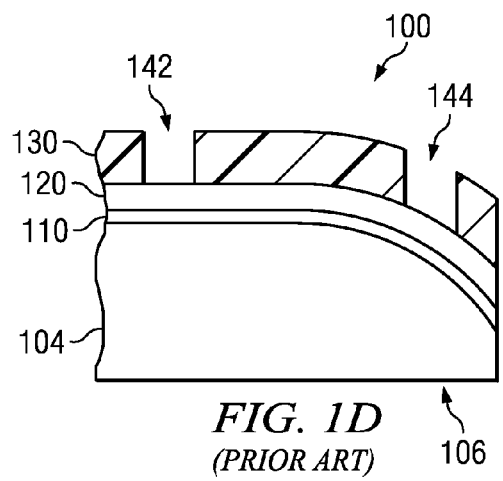
Figure 1E:
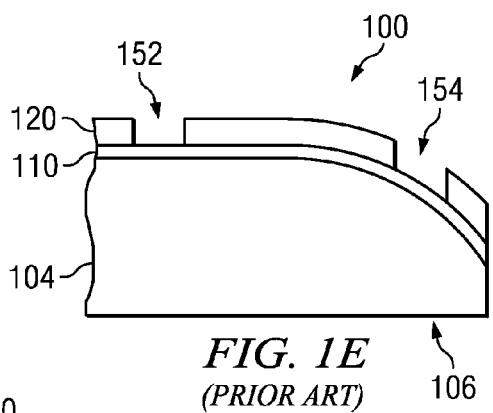

The method of making a semiconductor device 100 can also include developing the photoresist layer 130 over the surface 105 of the wafer 104 to form a hole pattern 142, 144, as shown in FIG. 1D. The method can further include etching the photoresist layer including but is not limited to, chemical, plasma, physical (ion milling), and reactive ion etching through the hole pattern 142, 144 into a dielectric layer 120 proximate the photoresist layer 130 to form a hole 152, 154, as shown in FIG. 1E. However, it should be noticed that the two exemplary holes 152 and 154 are not of the same width; hole 154 located proximate to the circumferential edge 106 is smaller in diameter than the hole 152 located on the substantially horizontal photoresist layer 130. This difference in the dimension of the hole 154 located proximate to the circumferential edge 106 and hole 152 located on the substantially horizontal region of the wafer 104 is due to the difference in the mask-to-wafer distance 166 during the step of exposing the photoresist layer 130. To circumvent this problem of underexposure, dies that are proximate to the circumferential edge 106 of the wafer 104 can be exposed multiple times or one time with higher exposure dose. The By-Shot-Exposure (BSE) technique can provide the option to use higher exposure on edge shots than those on center ones. However, by-shot-exposure does not have localized exposure adjustment to optimize the exposure for individual dies within a shot. Furthermore, although theoretically it is possible to optimize the dose for each edge die individually and expose every die individually by changing the scanner setup, this procedure can consume excessive tool time to make the adjustments and tool productivity could suffer. Moreover, the DoseMapper function on dual stage scanners, which controls the exposure dose, can adjust exposure intensity across slit and along the scan direction, but cannot be implemented on a single stage tool. In addition, the DoseMapper is limited by certain calculating formulas, and cannot be fully customized to match specific edge topography. Hence, currently there is no technique to overcome the problem of underexposure of edge shots in a systematic and automation friendly manner.

According to various embodiments of the present teachings, there is a method of making a semiconductor device 200 as shown in FIGS. 2A to 2F. The method of making a semiconductor device 200 can include forming a photoresist layer 230 over a surface 205 of a wafer 204, wherein the wafer 204 includes an edge 206 that has a substantially rounded profile, as shown FIGS. 2A and 2B, an array of dies 376 and at least one edge die 376a as shown in FIG. 3A.

In some embodiments, the method of making a semiconductor device 200 can include forming the photoresist layer proximate a dielectric layer 220 formed over the surface 205 of the wafer 204. In some other embodiments, the method making a semiconductor device 200 can include forming an etch stop layer 210 over the surface of the wafer 205, forming a dielectric layer 220 over the etch stop layer 210, and forming a photoresist layer 230 over the dielectric layer 220. In various embodiments, the etch stop layer 210 can be silicon dioxide, silicon nitride, and oxygen doped silicon carbide. In other embodiments, the dielectric layer 220 can be any inter-level dielectric material, such as, for example organo-silicate glass, fluorine doped silicate glass, and tetraethyl orthosilicate. In some other embodiments, the photoresist layer can be a deep ultra-violet (DUV) or other advanced high resolution photoresist. In various embodiments, the photoresist layer 230 can include a layer of negative photoresist. In some other embodiments, the photoresist layer 230 can include a layer of positive photoresist including a resin that is initially insoluble in a developer but becomes soluble when exposed to light or another energy source. In various embodiments, spin-on techniques can be used to deposit the photoresist layer 230 over the surface of the wafer 204. The deposition of the photoresist layer 230 can be followed by curing. The curing process can include baking or heating of the wafer 204, which can cause the photoresist layer 230 to harden.

In various embodiments, the etch stop layer 210 can have a thickness from about 10 Å to about 800 Å. In some embodiments, the dielectric layer 220 can have a thickness from about 1000 Å to about 30000 Å. In some other embodiments, the photoresist layer 230 can have a thickness from about 2000 Å to about 13000 Å.

Figure 3B:
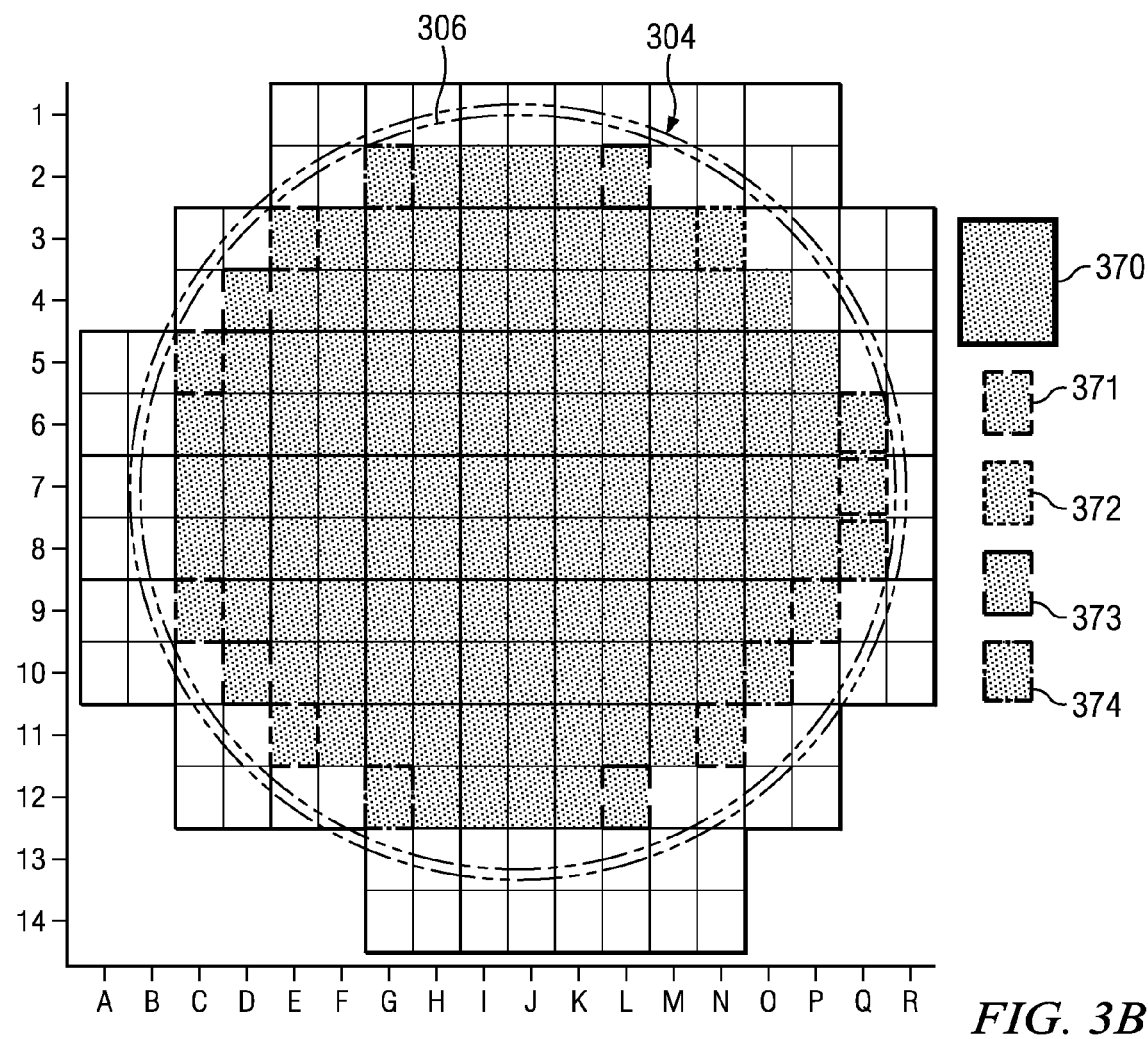
FIG. 3B is a schematic illustration of a wafer map showing an exemplary assignment of shot portions on the edge of a wafer.

The method of making a semiconductor device 200 can also include dividing a shot area 370 into a plurality of shot portions 371, 372, 373, 374 as shown in FIG. 3B. In various embodiments, the method of making a semiconductor device 200 can include dividing a shot area 370 into a first quartile 371, a second quartile 372, a third quartile 373, and a fourth quartile 374 as shown in FIG. 3B. In some embodiments, size and shape of the plurality of shot portions 371, 372, 373, 374 can be same. In other embodiments, size and shape of the plurality of shot portions 371, 372, 373, 374 can be different. Yet, in some other embodiments, at least one of the plurality of shot portions 371, 372, 373, 374 can have a size and a shape different from the rest of the plurality of shot portions.

Figure 2A:
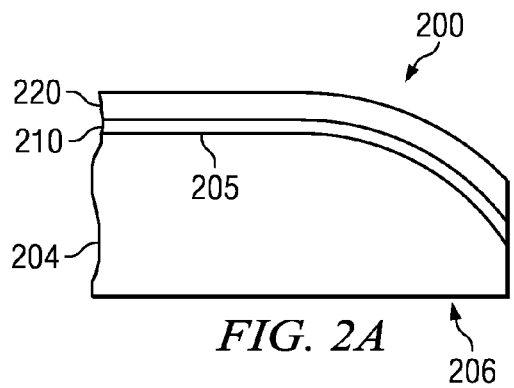
FIGS. 2A-2F illustrate an exemplary method of making a semiconductor device in accordance with various embodiments of the present teachings.
Figure 2B:
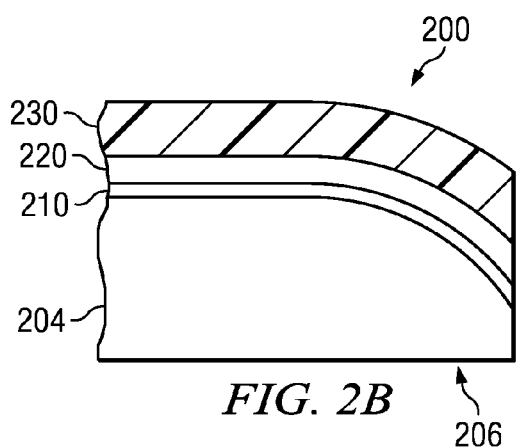
Figure 2C:
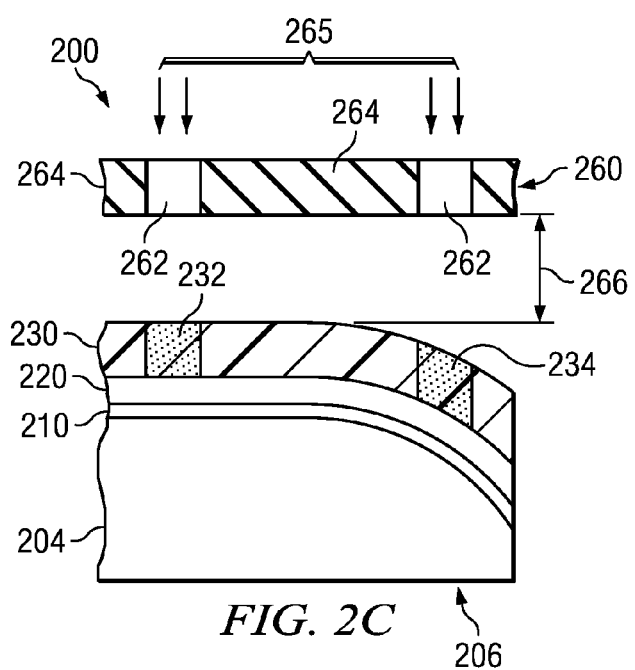
Figure 2D:
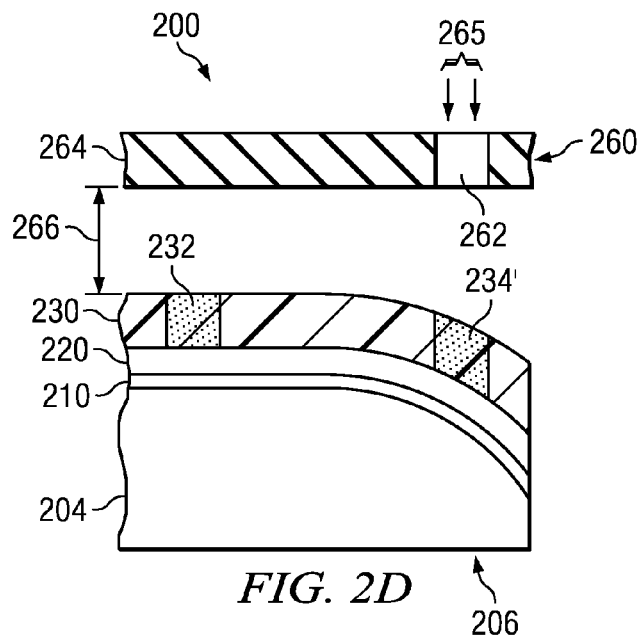

FIG. 3B is a schematic illustration of a wafer map showing an exemplary assignment of shot portions 371, 372, 373, 374 on the edge of a wafer 304. The shot area 370 can include the spatial area receiving energy from a light source during a single exposure of light 165. There are total of 52 shot areas over the wafer 304, and each of the 52 shot areas over the wafer 304 can be divided into a plurality of shot portions 371, 372, 373, 374. Each of the shot portions 371, 372, 373, 374 can cover one or more dies on the wafer 304. Furthermore, there are two kinds of shot portions. The first kid of shot portion are edge shot portions that are proximate to the circumferential edge 306 of the wafer 304, 204, such as those identified by the coordinates 2G, 3E, 4D, 5C, 9C, 10D, 11E, 12G, 12L, 11N, 8Q, 7Q, 3N, 2L, etc. in FIG. 3B and cover the edge dies 376a, as shown in FIG. 3A on the wafer 304, 204. The second kind of shot portions are non-edge shot portions that are not proximate to the circumferential edge 306 of the wafer 304, such as those identified by the coordinates E6, E7, F6, F7, G6, G7, M6, N6, I9, I4, etc. in FIG. 3B and cover the full dies 376b, as shown in FIG. 3A on the wafer 304, 204. Hence, the full dies covered by the non-edge shot portions do not include edge dies 376a, and therefore the holes formed on these dies do not suffer from underexposure deformities at conventional exposure intensities. In particular, the holes formed on full dies 376b covered by non-edge shot portions can look similar to the holes 152, 252 as shown in FIGS. 1E and 2F. Furthermore, the holes formed on edge dies 376a covered by edge shot portions can look similar to the hole 154 as shown in FIG. 1E. However, if the identified edge shot portions on the edge of the wafer 304 can be exposed one or more times while the non-edge shot portions which are not identified can be blocked as shown in FIG. 2D, the holes formed on the edge dies 376a covered by edge shot portions can look similar to the hole 252 as shown in FIG. 2F. The exposure blocking, as shown in FIG. 2D can be accomplished by blinding the photolithographic scanner.

The method of making a semiconductor device 200 can further include using opaque shutters called blinding mechanisms within a scanner to block light from all areas of the reticle and/or mask except for specific shot portions. The method of making a semiconductor device 200 can also include assigning a blind ID to each of the plurality of shot portions, and identifying one or more edge shot portions on the edge of the wafer for additional exposure. In various embodiments, assigning a blind ID to each of the plurality of shot portions can include assigning a first blind ID comprising a first blind size to a first shot portion, a second blind ID comprising a second blind size to a second shot portion, and so on. In some embodiments, the first quartile 371 of the shot area 370 can be assigned a first blind ID comprising a first blind size, the second quartile 372 of the shot area 370 can be assigned a second blind ID comprising a second blind size, the third quartile 373 of the shot area 370 can be assigned a third blind ID comprising a third blind size, the fourth quartile 374 of the shot area 370 can be assigned a fourth blind ID comprising a fourth blind size, and the whole shot 370 can be assigned a fifth blind ID comprising a fifth blind size.

Referring back to FIG. 2C, the method of making a semiconductor device 200 can also include exposing the photoresist layer 230 through a mask 260 to create a photolithographic image 232, 234 on the wafer 204. The method can further include identifying one or more edge shot portions on the edge 206, 306 of the wafer 204, 304 for additional exposure and exposing one or more times identified one or more edge shot portions such as that represented by the photographic image 234' on the edge 206, 306 of the wafer 204, 304 and blocking non-identified one or more edge shot portions as shown in FIG. 2D.

Figure 2E:
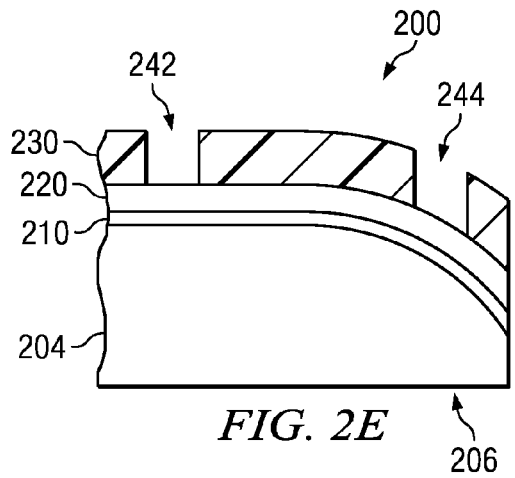
Figure 2F:
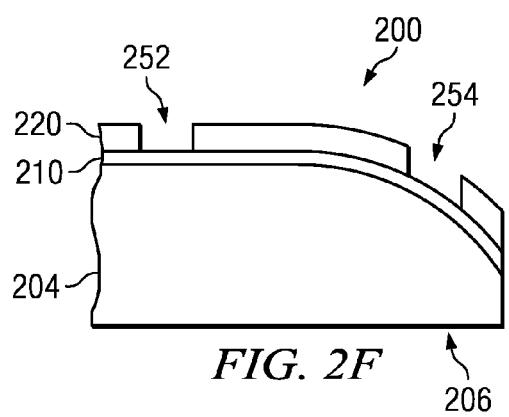

The method of making a semiconductor device 200 can also include developing the photoresist layer 230 over the surface 205 of the wafer 204 to form a hole pattern 242, 244, as shown in FIG. 2E. The method can further include etching including but is not limited to, chemical, plasma, physical (ion milling), and reactive ion etching through the hole pattern 242, 244 into a dielectric layer 220 proximate the photoresist layer 230 to form a hole 252, 254, as shown in FIG. 2F. It should be noticed that the holes 252 and 254 can be of substantially same dimensions due to the selective additional exposure of the edge photolithographic image 234'.

In various embodiments, the method of making a semiconductor device 200 can include positioning a mask 260 including at least one aperture 262 and at least one blocking portion 264 proximate to the surface 205 of the wafer 204 and directing energy through the mask 260 to expose an area of the photoresist layer 230 that corresponds with the identified one or more edge shot portions on the edge 206 of the wafer 204. In other embodiments, the method of making a semiconductor device 200 can include forming one or more via holes and contact holes. In some other embodiments, the method of making a semiconductor device 200 can also include overlaying additional exposures.

Figure 4:
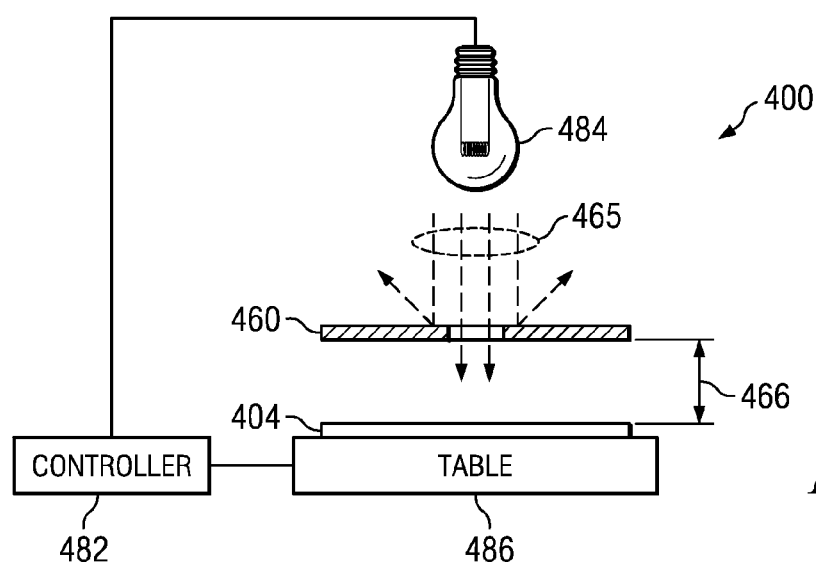
FIG. 4 is a schematic illustration of an exemplary system for forming a semiconductor device in accordance with various embodiments of the present teachings.

FIG. 4 is a schematic illustration of an exemplary system 400 for forming a semiconductor device 200 in accordance with various embodiments of the present teachings. The system 400 can include a controller 482 disposed to position a wafer 404 proximate to a light source 484, wherein the wafer 404 can include a photoresist layer 230 over a surface 205 of the wafer 204, 304, an edge 206, 306 that has a substantially rounded profile, an array of dies 376, and at least one edge die 376a. The controller 482 can be disposed to divide a shot area 370 into a plurality of shot portions 371, 372, 373, 374 and assign a blind ID to each of the plurality of shot portions. In some embodiments, the controller 482 can divide a shot area into a first quartile 371, a second quartile 372, a third quartile 373, and a fourth quartile 374. In other embodiments, the controller 482 can be disposed to assign a first blind ID comprising a first blind size to a first shot portion, such as, for example, the first quartile 371, a second blind ID comprising a second blind size to a second shot portion, such as, for example, the second quartile 372, a third blind ID comprising a third blind size to a third shot portion, such as, for example, the third quartile 373, a fourth blind ID comprising a fourth blind size to a fourth shot portion, such as, for example, the fourth quartile 374, and a fifth blind ID comprising a fifth blind size to a whole shot 370. The controller 482 can further be disposed to identify one or more edge shot portions on the edge 206, 306 of the wafer 204, 304 for additional exposure and expose one or more times identified one or more edge shot portions on the edge 206, 306 of the wafer 204, 304 and block non-identified one or more non-edge shot portions. The exemplary system 400 for forming a semiconductor device 200 can also include a light source 484 coupled to the controller 482. In various embodiments, the system 400 can also include a wafer table 486. The light source 484 can include a laser, lamp, or other suitable apparatus for generating a beam of light 265, 465 that is directed at the wafer 404. In various embodiments, the light 265, 465 from the light source 484 can be screened by a mask 460. In some embodiments, the controller 482 can be disposed to position a mask 460 comprising at least one aperture and at least one blocking portion proximate to the surface of the wafer 404 and direct energy through the mask 460 to expose an area of the photoresist layer 230 that corresponds with the identified one or more edge shot portions on the edge of the wafer 204, 304, 404. In other embodiments, the controller 482 can be disposed to overlay the additional exposure. Although a single controller 482 is illustrated as being coupled to the light source 484 and the wafer table 486, one of ordinary skill in the art would understand that each component within the system 400 can be associated with a controller. Accordingly, in some embodiments, the functionality described for controller 482 can be performed by one or many controllers within the system 400.

According to various embodiments, there is a method of making one or more holes 252, 254 as illustrated in FIGS. 2A to 2F. The method can include forming a photoresist layer 230 over a surface 205 of a wafer 204, wherein the wafer 204 can include an edge 206 that has a substantially rounded profile, as shown in FIG. 2B, an array of dies 376, and at least one edge die 376a, as shown in FIG. 3A. In some embodiments, the step of forming a photoresist layer 230 over a surface 205 of a wafer 204 can include forming an etch stop layer 210 over the surface 205 of the wafer 204, forming a dielectric layer 220 over the etch stop layer 210 and forming a photoresist layer 230 over the dielectric layer 220. The method of making one or more holes 252, 254 can also include dividing a shot area 370 into a plurality of shot portions 371, 372, 373, 374 and assigning a blind ID to each of the plurality of shot portions 371, 372, 373, 374. In various embodiments, the method of making one or more holes 252, 254 can include dividing a shot area 370 into a first quartile 371, a second quartile 372, a third quartile 373, and a fourth quartile 374. In some embodiments, size and shape of the plurality of shot portions 371, 372, 373, 374 can be same. In other embodiments, size and shape of the plurality of shot portions 371, 372, 373, 374 can be different. Yet, in some other embodiments, at least one of the plurality of shot portions 371, 372, 373, 374 can have a size and a shape different from the rest of the plurality of shot portions. In other embodiments, the method of making one or more holes 252, 254 can also include assigning a first blind size to a first shot portion, such as, for example, the first quartile 371, a second blind ID comprising a second blind size to a second shot portion, such as, for example, the second quartile 372, and so on. The method of making one or more holes 252, 254 can further include identifying one or more edge shot portions on the edge of the wafer 204 for additional exposure as shown in FIG. 3B and exposing one or more times identified one or more edge shot portions on the edge of the wafer 204 while blocking non-identified one or more non-edge shot portions as shown in FIG. 2D. The method of making one or more holes 252, 254 can also include developing the photoresist layer 230 over the surface of the wafer 204 to form a hole pattern 242, 244 as shown in FIG. 2E and etching through the hole pattern 242, 244 into a dielectric layer 220 proximate the photoresist layer 230 as shown in FIG. 2F.

According to various embodiments, the method of making one or more holes 252, 254 can further include positioning a mask 260 including at least one aperture 262 and at least one blocking portion 264 proximate to the surface of the wafer 204 and directing energy through the mask 260 to expose an area of the photoresist layer 230 that corresponds with the identified one or more edge shot portions on the edge of the wafer 204. The method of making one or more holes 252, 254 can also include overlaying additional exposures to insure hole integrity. According to various embodiments, one or more holes can include one or more via holes. In other embodiments, one or more holes can include one or more contact holes.

Table 1 shows a comparison of size of isolated and dense edge vias formed by conventional method and by "By-Die-Exposure", the method of making semiconductor devices 200 in accordance with various embodiments of the present teachings. Both the isolated and dense edge vias formed by the By-Die-Exposure had an additional exposure of 5 mJ/cm$^2$, whereas the isolated and dense edge vias formed by the conventional method had the same exposure as vias on the center dies.

TABLE 1

|  | Isolated Edge Vias | | Dense Edge Vias | |
| --- | --- | --- | --- | --- |
|  | Conventional | By-Die-Exposure | Conventional | By-Die-Exposure |
|  | 138.7 | 150.2 | 131.6 | 150.2 |
|  | 134.6 | 147.7 | 134.7 | 149.7 |
|  | 138.7 | 155.1 | 136.8 | 150.3 |
|  | 134.2 | 153.8 | 132.6 | 152.1 |
| Mean Diameter | 136.6 | 151.7 | 133.9 | 150.6 |
| Stdev | 2.5 | 3.4 | 2.3 | 1.1 |

As shown in Table 1, both the isolated and the dense edge vias formed by the By-Die-Exposure are larger in diameter by about ±15 nm as compared to those formed by the conventional method. Therefore, the via at the edge of the wafer are closer in size to the vias at the non-edge shot area.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of making a semiconductor device, the method comprising:
    forming a photoresist layer over a top surface of a wafer, wherein the surface comprises a flat substantially horizontal inner region and a non-flat substantially rounded outer region, whereby first die areas are defined located completely on the inner region and second die areas are defined located at least partly on the non-flat substantially rounded outer region;
    dividing a single lithographic exposure shot area into a plurality of shot area portions;
    assigning a respective blinding mechanism shutter setting to each of the plurality of shot area portions of the single lithographic exposure shot area based on presence or absence of first and second die areas; and
    exposing the photoresist layer in the shot area through a mask to create a photolithographic image on the wafer, including using the assigned shutter settings to provide greater exposure to shot area portions with second die areas than to shot area portions of the single lithographic exposure shot area without second die areas.

2. The method according to claim 1, wherein dividing the shot area into a plurality of shot area portions comprises dividing the shot area into a first quartile, a second quartile, a third quartile, and a fourth quartile.

3. The method according to claim 1, wherein assigning a shutter setting comprises assigning a respective blind identification and an associated blind size to each of the plurality of shot area portions.

4. The method of claim 3, wherein the shot area is divided into shot area portions including first, second, third and fourth quartiles.

5. The method of claim 4, wherein the shot area is divided into shot portions also including a whole area shot.

6. The method of claim 5, wherein using the assigned shutter settings to provide greater exposure to shot area portions with second die areas comprises using opaque shutters within a photolithographic scanner to block light from first die areas.

7. The method according to claim 1, wherein the image is an image of a pattern for forming one or more via holes and contact holes.

8. The method according to claim 7, further comprising developing the exposed photoresist layer to form the hole pattern; and etching through the hole pattern into a dielectric layer under the photoresist layer to form the one or more via holes and contact holes.

9. The method according to claim 1, further comprising repeating the dividing, assigning, and exposing steps for other shot areas.

10. The method of claim 1, wherein assigning the shutter setting comprises assigning a blind size.

11. The method of claim 1, wherein dividing the shot area into a plurality of shot area portions comprises assigning a respective blind identification to each shot area portion.

12. The method of claim 1, wherein using the assigned shutter settings to provide greater exposure to shot area portions with second die areas comprises using opaque shutters within a photolithographic scanner to block light from first die areas.

13. A method of making holes, the method comprising:
    forming a photoresist layer over a top surface of a wafer, wherein the surface comprises a flat substantially horizontal inner region and a non-flat substantially rounded outer region, whereby first die areas are defined located completely on the inner region and second die areas are defined located at least partly on the non-flat substantially rounded outer region;

dividing a single lithographic exposure shot area into a plurality of shot area portions;

assigning a respective blinding mechanism shutter setting to each of the plurality of shot area portions of the single lithographic exposure shot area based on presence or absence of first and second die areas; and exposing the photoresist layer in the shot area through a mask to create a photolithographic image of a hole pattern on the wafer, including using the assigned shutter settings to provide greater exposure to shot area portions with second die areas than to shot area portions without second die areas;

developing the exposed photoresist layer to form the hole pattern; and etching through the hole pattern into a dielectric layer to form the holes.

14. The method according to claim 13, wherein dividing the shot area into a plurality of shot area portions comprises dividing the shot area into a first quartile, a second quartile, a third quartile, and a fourth quartile.

15. The method according to claim 13, wherein assigning a shutter setting comprises assigning a respective blind identification and an associated blind size to each of the plurality of shot area portions.

16. The method according to claim 13, wherein the holes comprise one or more via holes.

17. The method according to claim 13, wherein the holes comprise one or more contact holes.

18. The method of making one or more holes according to claim 13 further comprising repeating the dividing, assigning, and exposing steps for other shot areas.

* * * * *